United States Patent
Pinos et al.

(10) Patent No.: US 12,426,429 B2
(45) Date of Patent: Sep. 23, 2025

(54) HIGH RESOLUTION MONOLITHIC RGB ARRAYS

(71) Applicant: PLESSEY SEMICONDUCTORS LTD, Plymouth Devon (GB)

(72) Inventors: Andrea Pinos, Plymouth Devon (GB); Jun-Youn Kim, Plymouth Devon (GB); Samir Mezouari, Plymouth Devon (GB); WeiSin Tan, Plymouth Devon (GB)

(73) Assignee: Plessey Semiconductors Ltd, Plymouth Devon (GB)

( * ) Notice: Subject to any disclaimer, the term of this patent is extended or adjusted under 35 U.S.C. 154(b) by 433 days.

(21) Appl. No.: 17/911,607

(22) PCT Filed: Mar. 15, 2021

(86) PCT No.: PCT/GB2021/050637
§ 371 (c)(1),
(2) Date: Sep. 14, 2022

(87) PCT Pub. No.: WO2021/186153
PCT Pub. Date: Sep. 23, 2021

(65) Prior Publication Data
US 2023/0119031 A1    Apr. 20, 2023

(30) Foreign Application Priority Data

Mar. 18, 2020 (GB) .................................. 2003923

(51) Int. Cl.
H10H 29/14    (2025.01)
(52) U.S. Cl.
CPC ................. H10H 29/142 (2025.01)

(58) Field of Classification Search
CPC . H10H 29/142; H10H 20/8312; H10H 20/812
See application file for complete search history.

(56) References Cited

U.S. PATENT DOCUMENTS

| | | | |
|---|---|---|---|
| 5,003,359 A * | 3/1991 | Abeles ................. | H01S 5/187 257/284 |
| 8,163,581 B1 * | 4/2012 | Or-Bach ............. | H10F 39/8023 438/93 |

(Continued)

FOREIGN PATENT DOCUMENTS

| | | |
|---|---|---|
| EP | 2 748 868 A1 | 7/2014 |
| JP | H06204558 A | 7/1994 |

(Continued)

OTHER PUBLICATIONS

Machine Translation of Tatsuya (JP H08213657 A) (Year: 1996).*

(Continued)

*Primary Examiner* — Jacob Y Choi
*Assistant Examiner* — Aaron Michael Wegner
(74) *Attorney, Agent, or Firm* — Cognition IP, P.C.; Edward Steakley

(57) ABSTRACT

A light emitting diode structure comprising: a p-type region; an n-type region; a light emitting region for recombination of carriers injectable by the p-type region and the n-type region; and a via passing through the light emitting region, wherein the via defines the perimeter of a light emitting surface of at least one pixel and comprises a material configured to enable injection of carriers into the p-type region or the n-type region, wherein one of the p-type region and n-type region is configured such that carriers generated in the one of the p-type region and the n-type region diffuses through the other one of the n-type region and the p-type region prior to recombination in the light emitting region.

24 Claims, 11 Drawing Sheets

(56) References Cited

U.S. PATENT DOCUMENTS

Figure 1A:
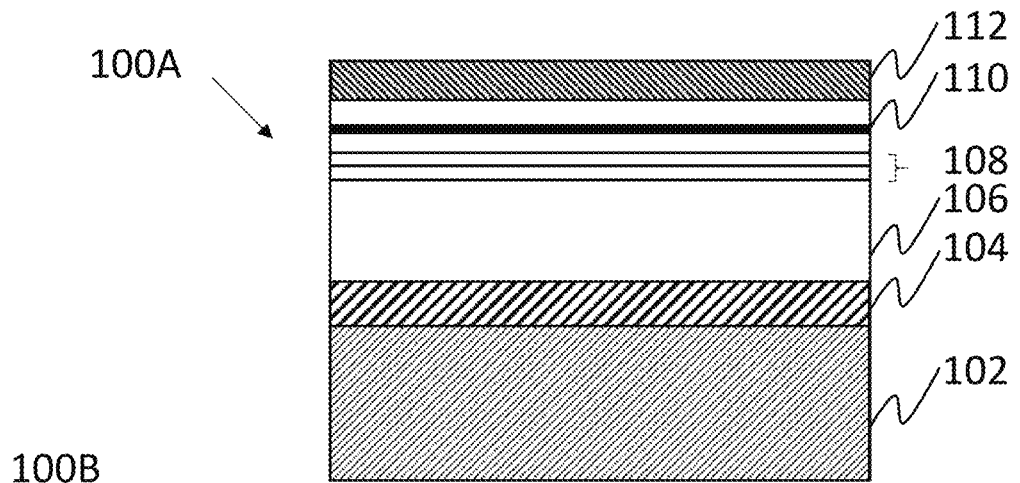

| | | | |
|---|---|---|---|
| 2018/0358343 A1 | 12/2018 | Wong et al. | |
| 2019/0198564 A1 | 6/2019 | Tandon et al. | |
| 2019/0206849 A1 | 7/2019 | Jang et al. | |
| 2019/0333455 A1 | 10/2019 | El-Ghoroury | |
| 2020/0020676 A1* | 1/2020 | Cok | H01L 25/0753 |
| 2020/0035748 A1* | 1/2020 | Xia | G02B 5/201 |
| 2020/0185351 A1* | 6/2020 | Mityashin | H01L 25/0756 |

FOREIGN PATENT DOCUMENTS

| | | | | |
|---|---|---|---|---|
| JP | H08213657 A | * | 8/1996 | H01L 33/12 |
| JP | 2001036141 A | | 2/2001 | |
| JP | 2002009335 A | | 1/2002 | |
| JP | 2017510980 A | | 4/2017 | |
| KR | 20080062962 A | | 7/2008 | |
| KR | 20140073284 A | | 12/2012 | |

OTHER PUBLICATIONS

Yamano, Koji, and Katsumi Kishino. "Selective area growth of InGaN-based nanocolumn LED crystals on AlN/Si substrates useful for integrated Î¼-LED fabrication." Applied Physics Letters 112.9 (2018). (Year: 2018).*

International Search Report and Written Opinion in PCT International Application No. PCT/GB2021/050637 mailed Jun. 8, 2021.

Leee Ming-Lun et al., "Planar GaN-Based Blue Light-Emitting Diodes with Surface p-n Junction Formed by Selective-Area Si-Ion Implantation", IEEE Transactions on Electron Devices, vol. 64, No. 10; Oct. 1, 2017, pp. 4156-4160.

Riuttanen L et al., "Diffusion injected multi-quantum well light-emitting diode structure", Applied Physics Letter, vol. 104, No. 8; Feb. 24, 2014.

* cited by examiner

HIGH RESOLUTION MONOLITHIC RGB ARRAYS

CROSS-REFERENCE TO RELATED APPLICATIONS

This application is a 35 U.S.C. § 371 national stage application of PCT International Application No. PCT/GB2021/050637, filed on Mar. 15, 2021, which claims the benefit of Great Britain Application No. 2003923.6, filed Mar. 18, 2020, which are hereby incorporated by reference in their entirety.

FIELD OF THE INVENTION

The invention relates to light emitting diode structures and methods of forming light emitting diode structures. In particular, but not exclusively, the invention relates high resolution monolithic arrays of light emitting diode structures.

BACKGROUND OF THE INVENTION

Conventional red-green-blue (RGB) micro light emitting diode (μLED) arrays of light emitting pixels are typically achieved using pick-and-place techniques, or by the use of colour conversion material deposited or integrated into standard planar light emitting diode (LED) structures. However, as the pixel pitch in such arrays is reduced to very small pitches (e.g., less than 5 μm) in order to provide higher resolution arrays, a number of difficulties arise.

For example, the use of pick-and-place can be impractical due to high cost, low throughput and the limit of positional accuracy when transferring the μLEDs. In the case of colour conversion, the use of such a technique is limited by the phosphor size used for colour conversion, which is typically greater than 10 μm (i.e., greater than the pixel pitch in arrays with very small pitches needed for higher resolutions). Further, colour conversion techniques may be subject to poor reliability and inefficiencies due to small absorption coefficients associated with quantum dots (QDs). For example, thicknesses of colour-converting QD material in excess of 10 μm are needed fully to absorb the blue emission exciting them, thus making them unsuitable for very small pixel pitch arrays.

In order to avoid having to transfer LEDs, and in order to provide high-quality efficient emission, it would be beneficial to provide a native array of LEDs on the same substrate. One approach for building a native array of LEDs on the same substrate relies on selective area growth of nanowires, which are arrays of individual structures that are grown substantially perpendicular to a patterned growth substrate to form light emitting structures where the light emitting surface is defined by the cross-sectional area of the nanowire using typical epitaxial quantum well structures grown between epitaxial n-type and p-type doped layers. However, the growth of such nanowires is generally difficult to control and may be subject to severe limitations in the light efficiency and colour gamut achievable due to poor light extraction efficiency and impurity incorporation, for example.

SUMMARY OF THE INVENTION

In order to mitigate for at least some of the above-described problems, there is provided a light emitting diode structure in accordance with the appended claims. Further, there is provided an array of light emitting diode structures and method of forming one or more light emitting diode structures in accordance with the appended claims.

In an example there is provided a light emitting diode structure comprising: a p-type region; an n-type region; a light emitting region for recombination of carriers injectable by the p-type region and the n-type region; and a via passing through the light emitting region, wherein the via defines the perimeter of a light emitting surface of at least one pixel and comprises a material configured to enable injection of carriers into the p-type region or the n-type region, wherein one of the p-type region and n-type region is configured such that carriers generated in the one of the p-type region and the n-type region diffuses through the other one of the n-type region and the p-type region prior to recombination in the light emitting region. Advantageously, vias used to isolate pixels are also used to enable carrier injection into light emitting regions.

Preferably, the light emitting region comprises at least one epitaxial quantum well layer. Advantageously, epitaxial quantum well layers are grown with high crystalline quality, leading to efficient light generation.

Preferably the p-type region and the n-type region are on the same side of the light emitting region. Beneficially, carriers can diffuse to the light emitting region against the electric field of a forward biased junction, meaning that no electron blocking layer is required. Further, the doped p-type and n-type regions can be thin layers and where they are on the same side, only very shallow etches can be used to provide electrical isolation, thereby limiting etch damage caused by electrically isolating individual devices.

Preferably, the material comprises at least part of the n-type region or p-type. Beneficially, the very vias used to enable carrier injection are also used to isolate pixels.

Preferably, the material comprises a conductive material, preferably wherein the conductive material is a metal. Advantageously, the metal enables electrical connection with one of the p-type or n-type regions, thereby enabling carrier injection whilst isolating individual LED devices/pixels. Further, metal may be highly reflective, thereby providing good optical isolation. Furthermore, the deposition of metal in the vias removes any need to align metal to provide contact with one of the p-type or n-type regions, as the metal self aligns upon deposition.

Preferably, the light emitting diode structure comprises a further light emitting region. Advantageously, the light emitting regions can be energized simultaneously or individually and may be configured to have the same or different primary peak wavelengths.

Preferably the light emitting region and the further light emitting region are separated by an undoped region thereby to provide a stack of light emitting regions. Advantageously, carrier injection into the different light emitting regions is achieved by forming via connections to the light emitting regions. Beneficially, in the absence of p-type doping layers there is no issue with p-type dopant diffusion and the multiple quantum wells (MQWs) of the light emitting regions can be closer together with no need for a tunnel junction. Further, no electron blocking layers are needed in the structure.

Preferably the via passes through both the light emitting region and the further light emitting region. Advantageously, a common connection is provided for the light emitting regions, resulting in simpler processing of an initial epitaxial structure.

Preferably, the light emitting region and the further light emitting region are configured to emit light of different wavelengths. Advantageously, light of different primary peak wavelengths can be emitted by the structure and the structure can be implemented in a multi-colour array.

Preferably the light emitting region and the further light emitting region are arranged such that the surface areas of the light emitting region and further light emitting region partially overlap. Advantageously, in plan view, there are different regions arranged to provide light emitting surfaces that are based on different light emitting regions (and can thus be configured to provide different light emission, be it different intensity, timing or colour, etc., for example).

Preferably, the light emitting diode structure comprises at least three light emitting regions, wherein one of the light emitting regions emits blue light, one of the light emitting regions emits green light and one of the light emitting regions emits red light. Advantageously, the use of three light emitting region provides increased flexibility, including the ability to provide red-green-blue (RGB) light, at high resolution, for colour displays.

Preferably, the via is a grid via defining an array comprising a plurality of pixels. Advantageously, connection can be made in one process step. Further, the use a grid via defining pixels means that no electrical isolation etch between pixels is needed, allowing for tighter pixel integration.

Preferably wherein the grid via is arranged to provide a common electrode. Advantageously, the electrode can be used to selectively control emission from an individual pixel in a high resolution array of pixels Preferably at least one pixel of the plurality of pixels comprises a further electrode. Preferably, the further electrode is centrally located within the perimeter of the light emitting surface of at least one pixel. Advantageously, isolation of pixels is achieved simultaneously with individual control of light emission.

Preferably, at least two pixels are configured to emit light of different wavelengths. Advantageously, multiple colour outputs can be provided from a monolithic array.

Preferably, the light emitting region and/or further light emitting region is formed on an undoped epitaxial layer. Advantageously, the undoped epitaxial layer allows for electrical isolation of the pixel.

Preferably, the light emitting region and/or further light emitting region is formed between undoped epitaxial layers. Advantageously, the undoped epitaxial layers allow for electrical isolation of pixels, as well as enabling processing of epitaxial structures for individual pixel connection by etching through the light emitting region and/or further light emitting region formed between undoped epitaxially layers.

Preferably, the undoped epitaxial layer is formed on a barrier layer configured to block vertical carrier diffusion. Advantageously, the light emitting structure can be formed on doped material that may form part of the substrate and/or preferable growth techniques, whilst enabling isolation of the light emitting region such that one of the n-type and p-type regions is formed to pass through the light emitting region.

Preferably, the light emitting diode structure is a gallium nitride (GaN) based structure. Gallium nitride is known for its properties in providing efficient light emitting diode devices with a range of primary peak wavelengths. The growth of gallium nitride structures is well developed and the growth and processing of such materials is controllable to provide high quality devices. Accordingly, preferably the undoped epitaxial layer is gallium nitride.

Preferably, the barrier layer is AlGaN. Advantageously, the barrier provides a stable surface for subsequent processing steps. Further, the barrier layer provides an etch stop for isolation of pixels by etching vias through the light emitting region.

Preferably, at least one of the n-type region and the p-type region is formed in a via that is connected to a planar n-type region or a planar p-type region respectively. Advantageously, the use of a planar region provides for light emission due to carrier diffusion and may be advantageous to reduce etch damage and loss of active region where a central via etch would otherwise be used for lateral injection of carriers into the light emitting region.

Preferably, at least one of the n-type region and the p-type region is formed by selected area growth. Advantageously, the selected area growth at least partially cures etch damage. Further, passivation is unnecessary as there are no remaining open surfaces cutting through the multiple quantum wells.

Preferably, the via is an etched via. Techniques for anisotropic etching are known and enable larger scale epitaxial structures to be grown and subsequently processed in order to provide light emitting diode structures that have pixel perimeters defined by the etched via(s). This means that known techniques for growing high quality and efficient epitaxial structures can be used, as opposed to smaller scale techniques such as patterned nanowire growth.

Preferably, the light emitting surface has an area based on the diffusion length of carriers within the light emitting region. Advantageously, the light emitting surface shape and/or size is optimizable based on the diffusion carrier length, which is useful to provide uniform light emission in micro LEDs.

Preferably, the light emitting surface area is less than or equal to 100 $\mu m2$, and more preferably less than or equal to 16 $\mu m2$. Advantageously, the definition of pixels using a via comprising n-type or p-type material enables the formation of micro LEDs having light emitting surfaces providing pixels with a high resolution.

Advantageously, the definition of pixels using a via enables the formation of micro LEDs having a high resolution that can be formed into an array. Such an array is suitable for connection to a backplane and hence integration into high resolution displays or other high resolution arrays that may be monochromatic array or multi-colour.

Preferably, the at least one pixel is defined peripherally entirely by a single electrode.

Preferably, there is provided a high resolution micro LED array comprising the light emitting diode structure.

Preferably, the array is a multi-colour array, preferably wherein the array has a pixel pitch less than 10 microns, more preferably less than 4 microns.

Preferably, the light emitting diode structure and/or array of micro LEDs is provided by forming a plurality of epitaxial layers on a substrate. Advantageously, forming a plurality of epitaxial layers on a substrate means that high quality structures can be provided in continuous growth, thereby to reduce growth time and impurities in the growth.

Preferably, the plurality of epitaxial layers comprises the n-type region and the light emitting region. Advantageously, such a plurality of epitaxial layers comprises layers of a conventional LED structure. Beneficially, conventional LED structures (which may be terminated after the p-cladding) can be used as a basis for the subsequent processing of monolithic micro LED arrays.

Preferably, the plurality of epitaxial layers are etched, such that the etching passes through the light emitting region to provide the via defining the pixel perimeter. Techniques for anisotropic etching are known and enable larger scale epitaxial structures to be grown and subsequently processed in order to provide light emitting diode structures that have pixel perimeters defined by the etched via(s). This means that known techniques for growing high quality and efficient epitaxial structures can be used, as opposed to smaller scale techniques such as patterned nanowire growth.

Preferably, conductive material is deposited or grown in the etched via. Advantageously, the very material used to inject carriers into the light emitting region is also used to define the perimeter of the light emitting surface of at least one pixel, isolating the pixel whilst still providing a source of carriers that enables efficient recombination of and light emission across the light emitting surface for the pixel.

Preferably, forming the further light emitting region comprises at least partially etching through at least one light emitting region in order locally to remove an unwanted longest wavelength. Advantageously, high quality epitaxial material is provided with shallow etching to enable exposure of light emitting surfaces that formed by a p-n junction on one side of the exposed light emitting surface, thereby providing penetration into the locally exposed light emitting region.

Preferably, forming the further light emitting region comprises at least partially etching through at least one light emitting region in order locally to remove an unwanted longest wavelength prior to forming each of the n-type region and the p-type region associated with the light emitting region and the further light emitting region respectively. Advantageously, at least one of the n-type region and p-type region is deposited/grown near the one or more exposed light emitting regions in a single step. Further, selected area overgrowth to provide the other of the n-type and p-type regions is performed in a single step for each exposed light emitting region, thereby reducing the necessary processing steps.

Preferably, the light emitting diode structure and/or array of micro LEDs is provided by forming a plurality of epitaxial layers on a substrate. Advantageously, forming a plurality of epitaxial layers on a substrate means that high quality structures can be provided in continuous growth, thereby to reduce growth time and impurities in the growth.

Preferably, the plurality of epitaxial layers comprises the n-type region and the light emitting region. Advantageously, such a plurality of epitaxial layers comprises layers of a conventional LED structure. Beneficially, conventional LED structures can be used as a basis for the subsequent processing of monolithic micro LED arrays.

Further aspects of the invention will be apparent from the description and the appended claims.

DETAILED DESCRIPTION OF AN
EMBODIMENT OF THE INVENTION

Figure 1B:
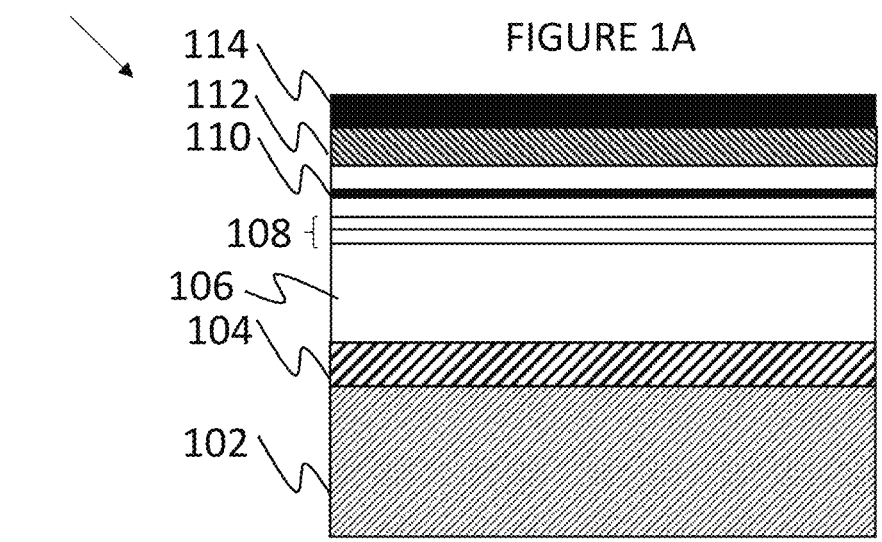
Figure 1C:
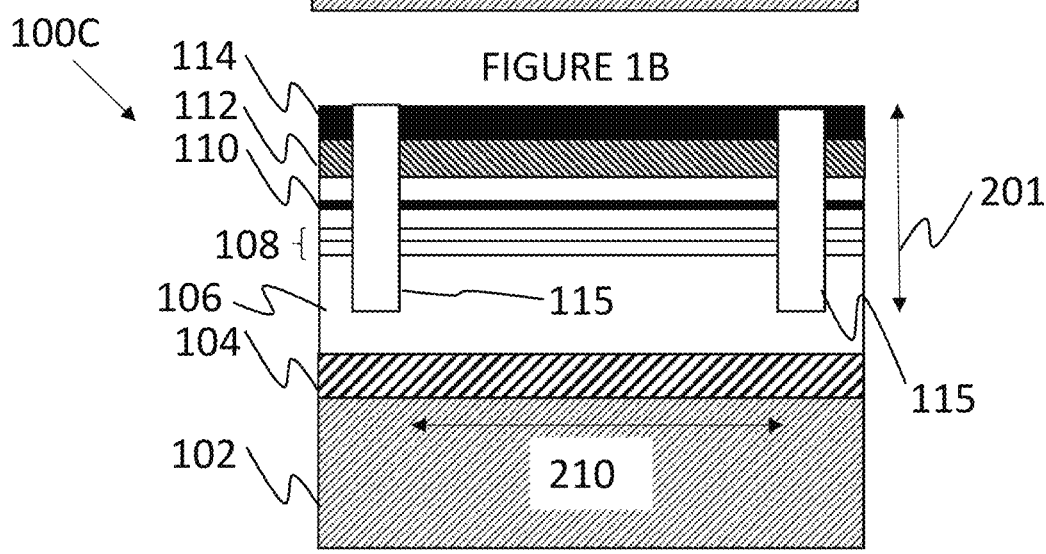
Figure 1D:
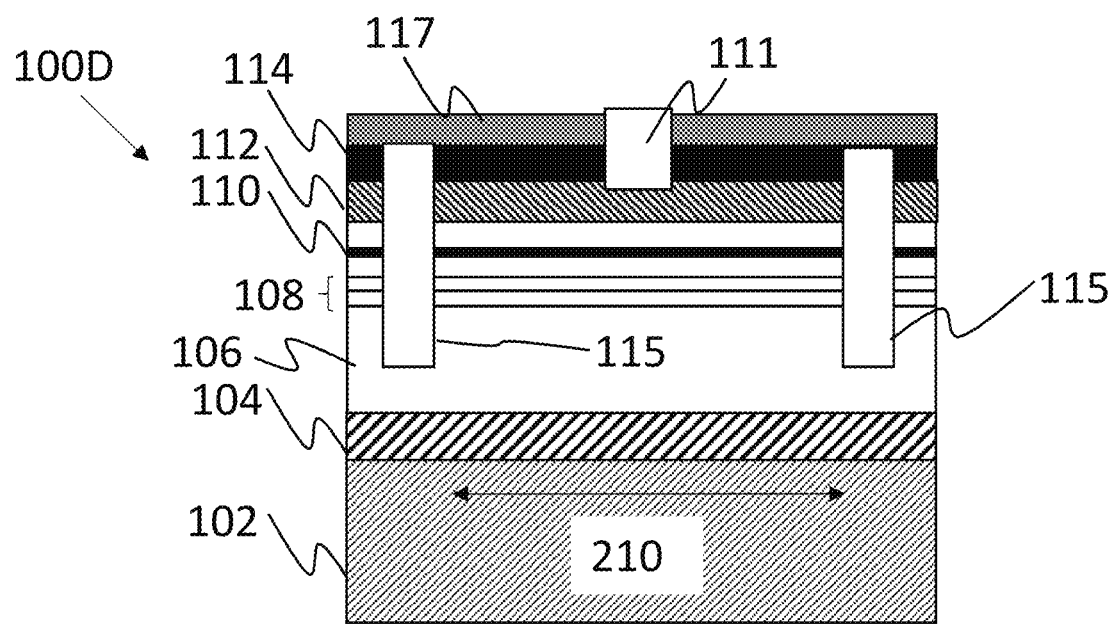
Figure 1E:
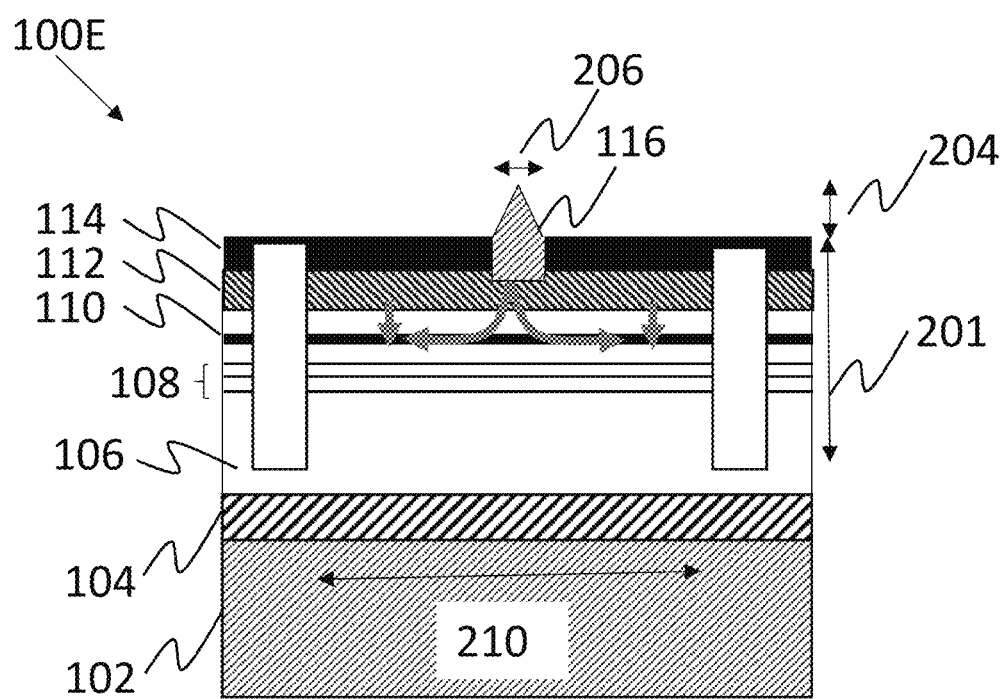
Figure 1F:
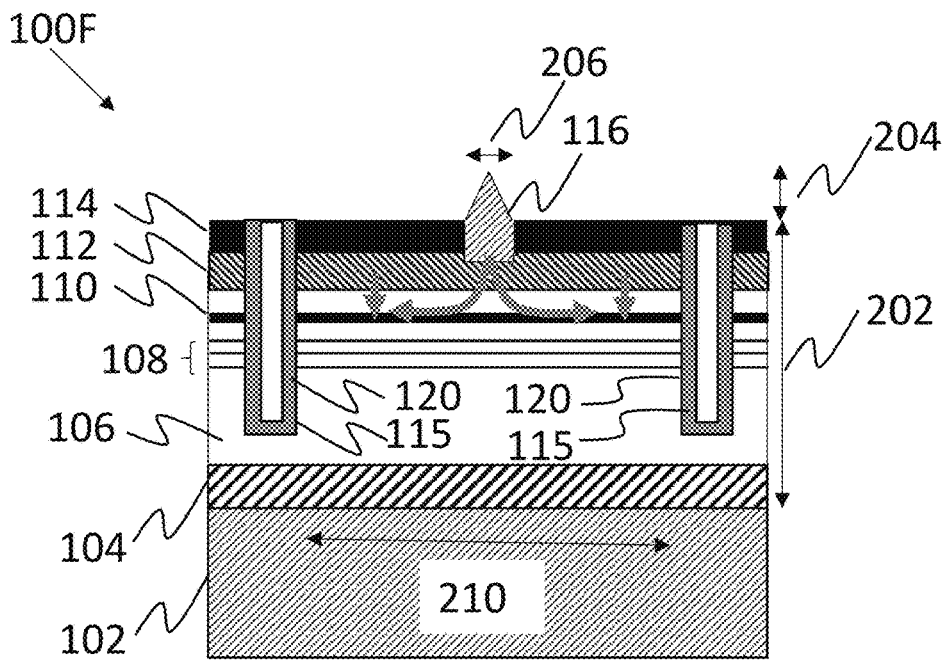
Figure 1G:
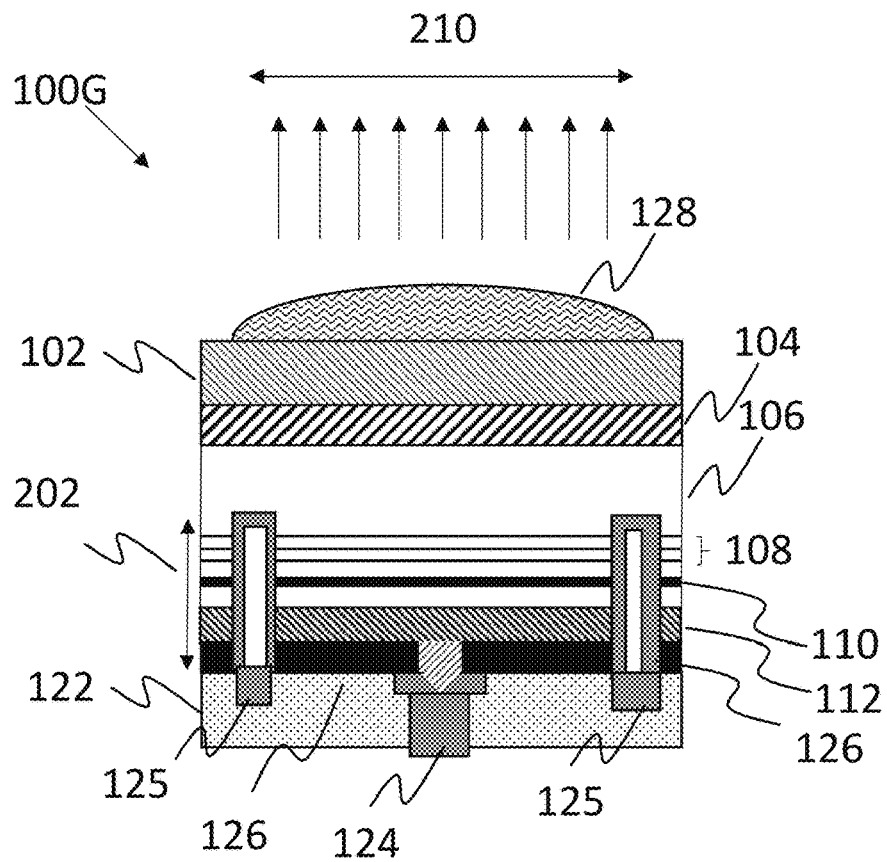
Figure 2:
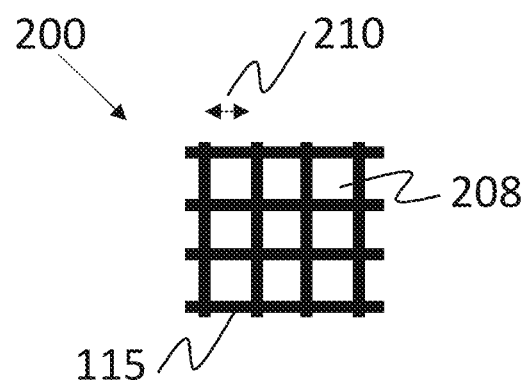
Figure 3:
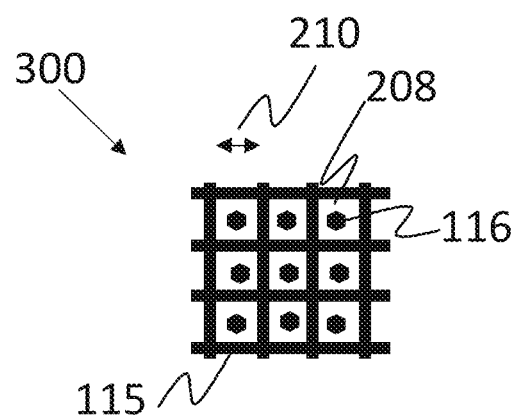
Figure 4:
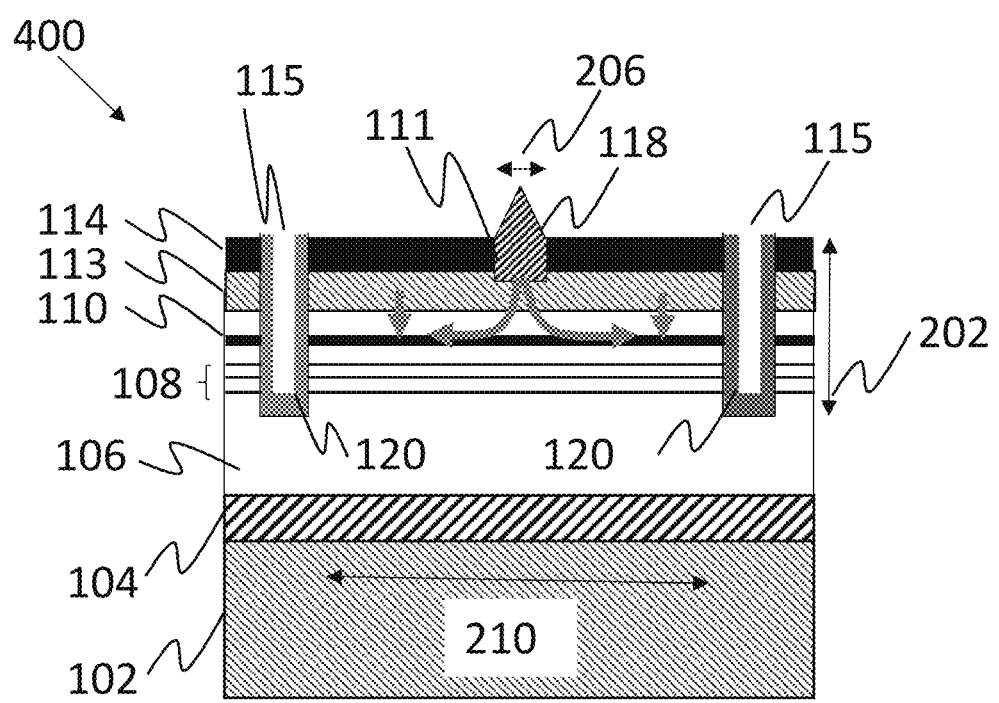
Figure 5:
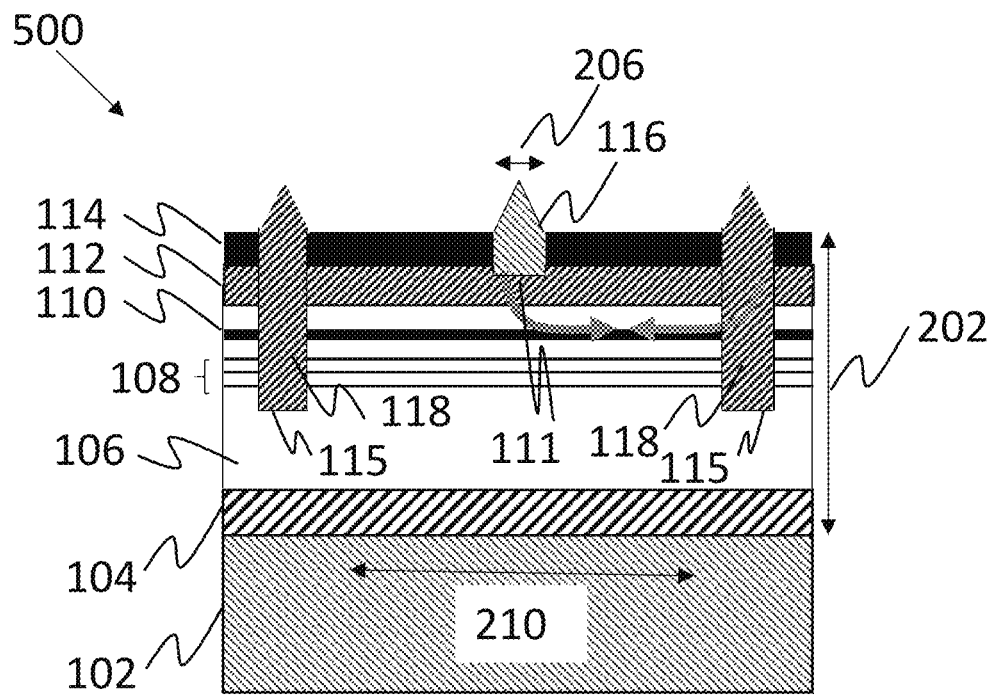
Figure 6:
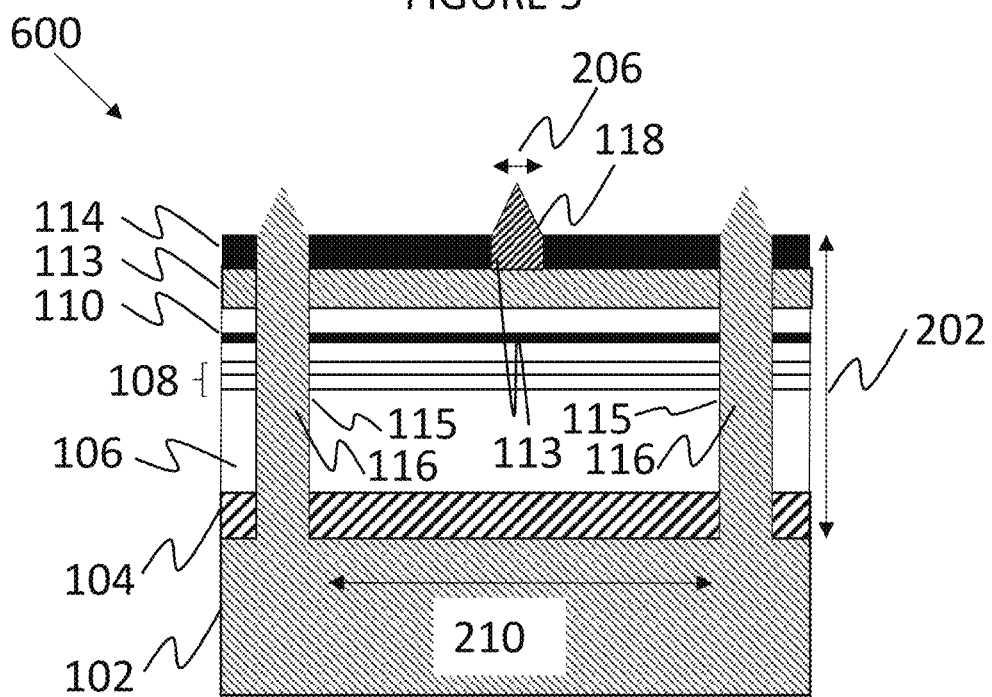
Figure 7:
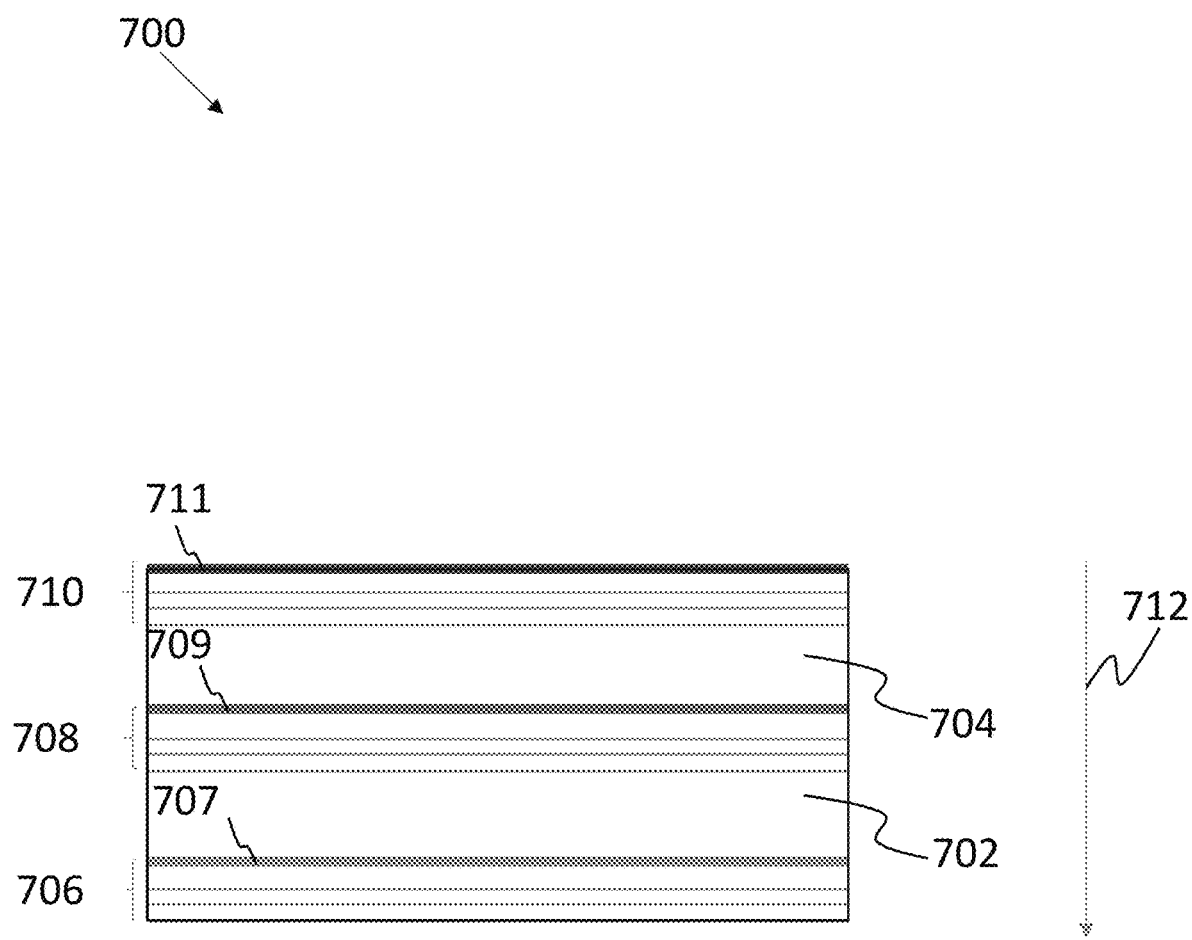
Figure 8A:
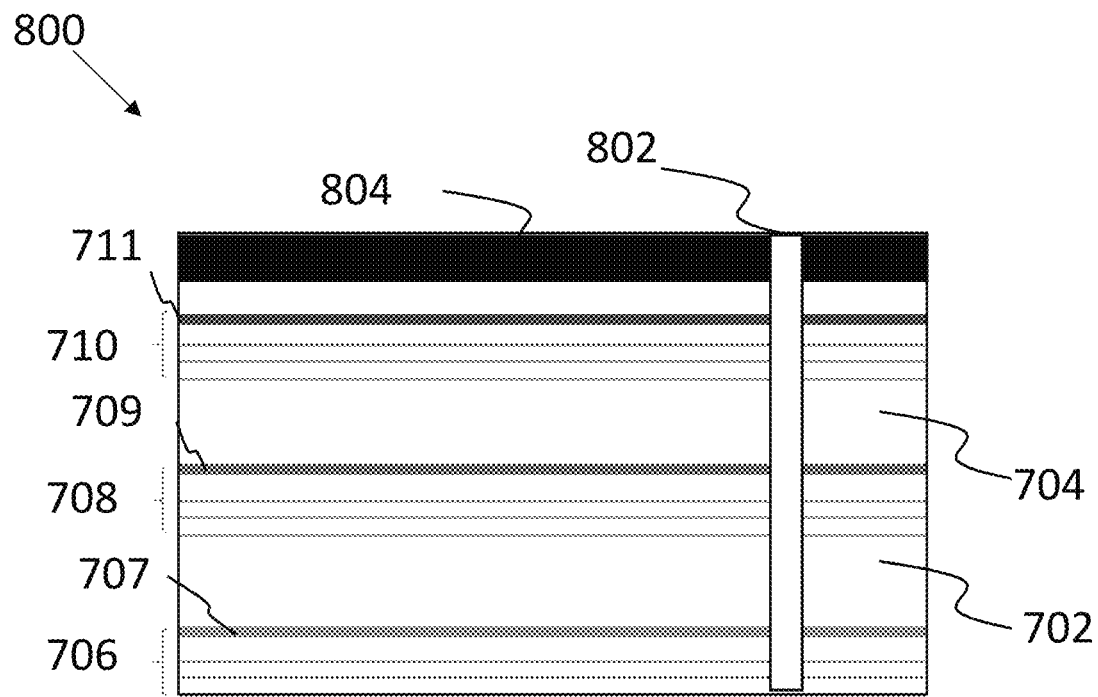
Figure 8B:
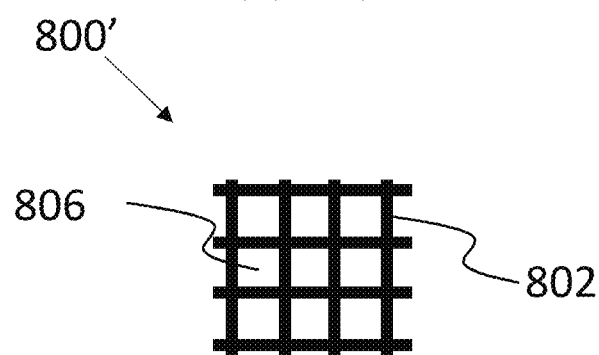
Figure 9A:
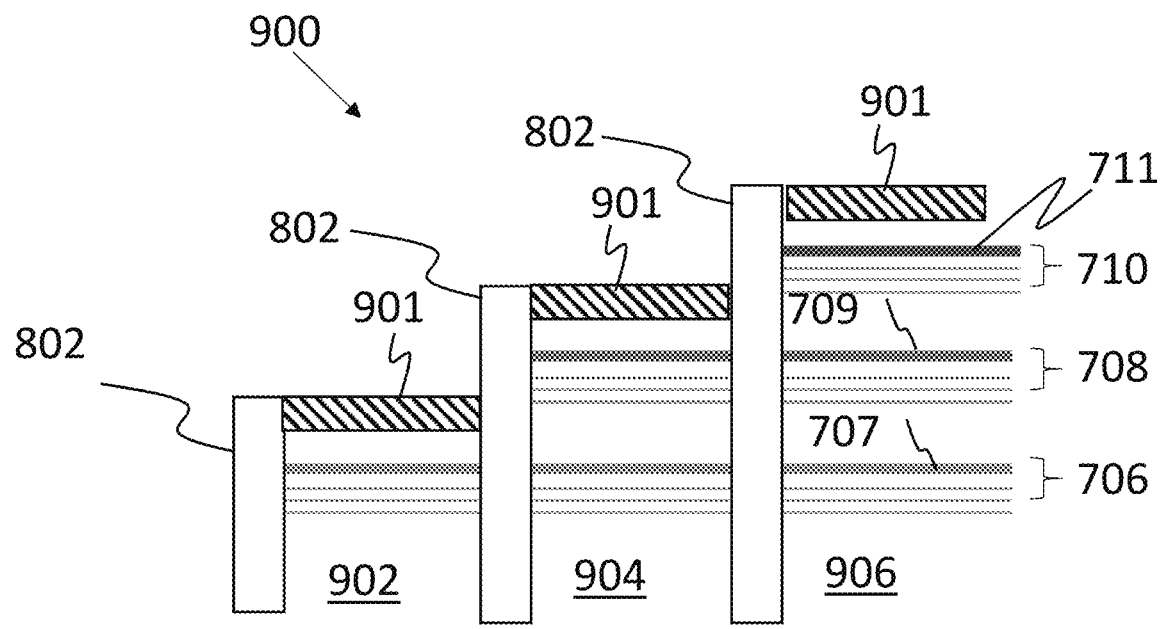
Figure 9B:
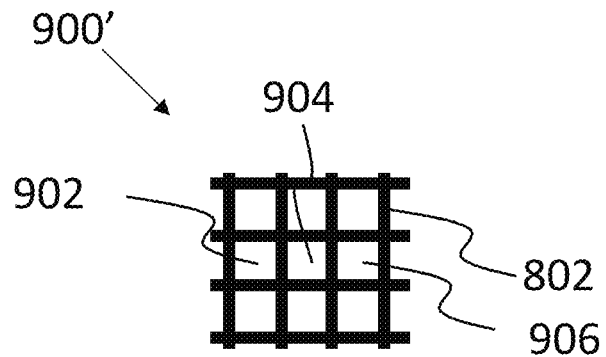
Figure 10A:
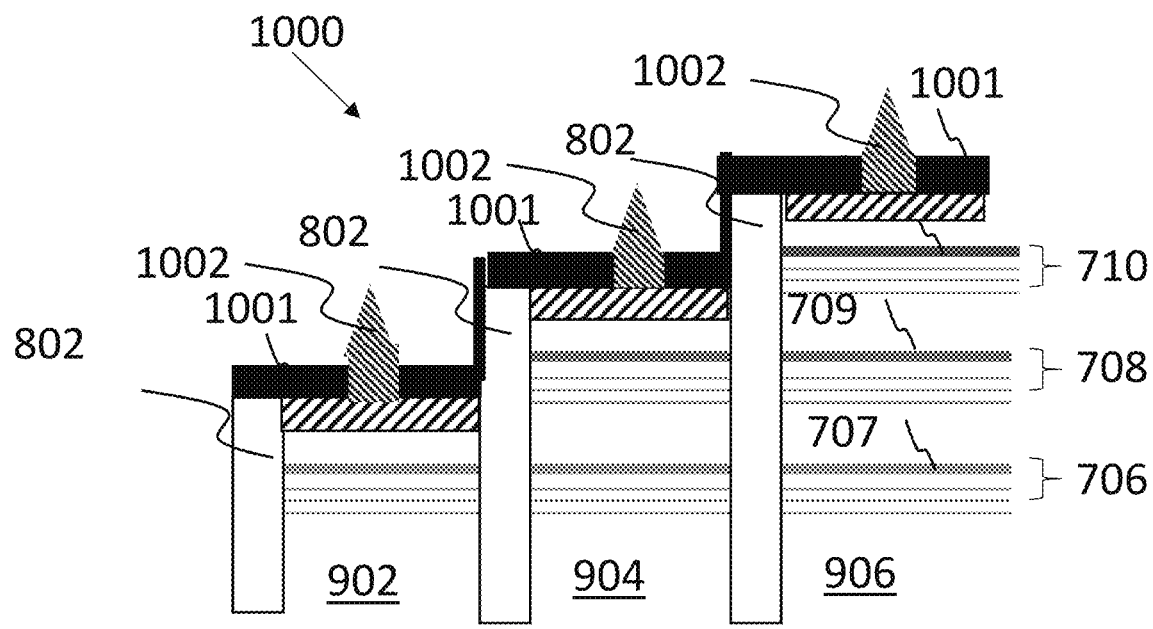
Figure 10B:
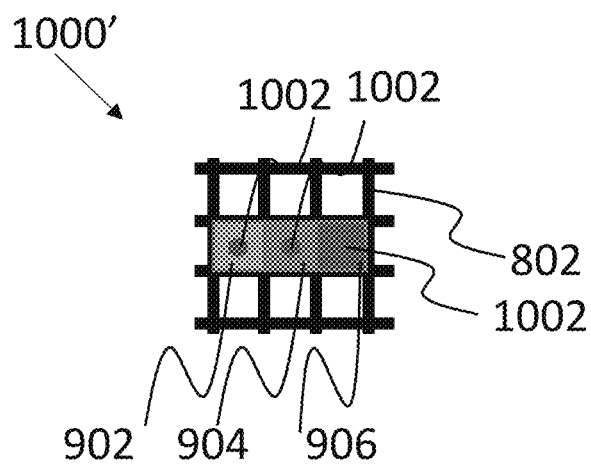
Figure 11:
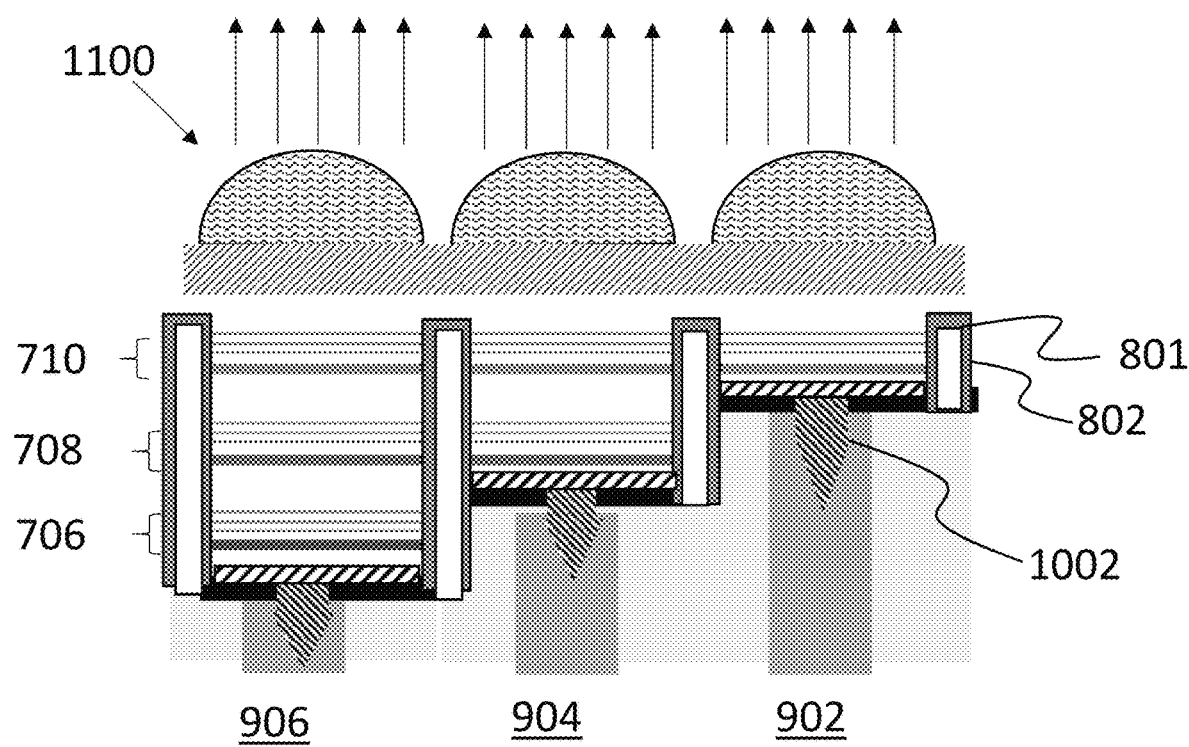

A detailed description of embodiments of the invention is described, by way of example only, with reference to the figures, in which:

FIG. 1A shows a cross sectional view of an epitaxial structure;
FIG. 1B shows a cross sectional view of a processed epitaxial structure;
FIG. 1C shows a cross sectional view of a processed epitaxial structure;
FIG. 1D shows a cross sectional view of a processed epitaxial structure;
FIG. 1E shows a cross sectional view of a processed epitaxial structure;
FIG. 1F shows a cross sectional view of a processed epitaxial structure;
FIG. 1G shows a cross sectional view of a processed epitaxial structure;
FIG. 2 shows a plan view of the processed epitaxial structure of FIG. 1C;
FIG. 3 shows a plan view of the processed epitaxial structure of FIG. 1F;
FIG. 4 shows a cross sectional view of a processed epitaxial structure;
FIG. 5 shows a cross sectional view of a processed epitaxial structure;
FIG. 6 shows a cross sectional view of a processed epitaxial structure;
FIG. 7 shows a cross sectional view of an epitaxial structure having three different light emitting regions;
FIG. 8A shows a cross sectional view of the processed epitaxial structure of FIG. 7;
FIG. 8B shows a plan view of the processed epitaxial structure of FIG. 8A;
FIG. 9A shows a cross sectional view of the further processed epitaxial structure of FIG. 8A;
FIG. 9B shows a plan view of the further processed epitaxial structure of FIG. 8A;
FIG. 10A shows a light emitting structure having three different light emitting regions;
FIG. 10B shows a plan view of the light emitting structure of FIG. 10A; and
FIG. 11 shows a processed light emitting structure of FIG. 10A.

Light emitting diodes (LEDs) are typically formed by processing light emitting structures that have been grown by the formation of epitaxial crystalline layers on relatively large wafer substrates in a reactor, such as an MOCVD (metalorganic chemical vapour deposition) reactor, MBE (molecular beam epitaxy) reactor or other chemical vapour deposition reactor, for example. For the reasons described above, known methods for creating arrays of high resolution micro-LEDs face difficulties in the processing of LEDs produced by crystalline grown on relatively large wafer substrates to provide micro-LEDs for high resolution arrays. The use of nanowire LED arrays to overcome these processing problems leads to difficulties in control of the growth process as well as generally poorer performance than is seen from conventional relatively large wafer substrate growth of LEDs.

The present disclosure describes micro-LEDs formed as part of a monolithic high resolution array by, advantageously, processing light emitting structures that can be grown on relatively large wafer substrates. Beneficially, compared with colour converted pixels, native colour pixels can be formed that are smaller, more efficient and more resistant to degradation. Compared with pick-and-place assembly, processing of epitaxial structures grown directly on a wafer means that there is no requirement to transfer millions of pixels (and associated failure in the transfer process) and thus there is higher throughput by forming arrays of pixels on wafers. Compared with nanowires, the processing of standard planar epitaxial deposited layer growth means that multiple quantum wells (MQWs) are formed in a way that provides high quality growth and hence relatively high internal quantum efficiency (IQE). Further, the processing of epitaxial structures provides planar devices that better lend themselves to light extraction using standard surface patterning techniques.

Further advantages arising from the described method and structure will be apparent in the following description. Methods of providing arrays of micro LEDs are described below with reference to various processing steps (the processing steps may include steps performed both in a growth reactor and outside a growth reactor, using other processing and/or growth equipment). The methods and structures are described with reference to III-V semiconductor materials. In particular, the methods and structures are described with reference to Nitride structures, including Gallium Nitride (GaN) based light emitting structures, which are well known to provide relatively high efficiency light emitting structures. However, in further examples, the methods and structures are applicable to light emitting structures based on other materials, in particular based on other semiconductor materials.

In the following figures, like reference numerals are used in order to illustrate aspects of the structures that relate to the same features, or equivalent features provided by the same, or similar, processes.

FIG. 1A shows a structure 100A that is an epitaxial structure 100A that forms the basis of a monochrome micro LED pixel array. Such a monochrome micro LED pixel array has a plurality of individual pixels, where each pixel may be individually addressable based on the way such monochrome micro LED pixel array is connected to a power source (e.g., depending on the arrangement of a backplane with respect to the micro LED pixel array).

The structure 100A is a GaN-based epitaxial multiple quantum well (MQW) structure, grown by metalorganic chemical vapour deposition (MOCVD), that is effectively an LED structure. Beneficially, known techniques can be used to provide high quality material that can be processed in order to provide a monolithic high resolution micro LED array.

In FIG. 1A there is shown an n-doped (n-GaN) n-type buffer region 102 upon which an AlGaN barrier layer 104, with 10% Aluminium, is grown. The n-type region buffer 102 is typically formed on a substrate (not shown). The AlGaN barrier layer 104 prevents vertical carrier diffusion from the n-type buffer region 102.

An undoped region 106 (GaN that is not intentionally doped) is grown on the barrier layer 104, and a GaN-based superlattice structure 108 is grown upon the undoped region 106. On top of the superlattice structure 108 there is a light emitting region 110 having multiple quantum wells (MQWs). The n-type region buffer 102, the barrier layer 104, the undoped region 106, the superlattice 108 and the light emitting region 110 are shown in cross-section as a plurality of epitaxial layers grown on a substrate (the substrate not being shown to the extent that the substrate is not the n-type buffer region 102 itself).

An undoped region 106 (GaN that is not intentionally doped) is grown on the barrier layer 104, and a GaN-based superlattice structure 108 is grown upon the undoped region 106. On top of the superlattice structure 108 there is a light emitting region 110 having multiple quantum wells (MQWs). The n-type region buffer 102, the barrier layer 104, the undoped region 106, the superlattice 108 and the light emitting region 110 are shown in cross-section as epitaxial layers grown on a substrate (not shown).

The light emitting region 110 has MQWs. Additionally or alternatively, the light emitting region 110 may have a single quantum well (SQW). Additionally or alternatively, the light emitting region 110 may include one or more quantum dots. The quantum wells and quantum dots confine carriers and, in use, provide a source of light based on emissive carrier recombination in the quantum structures following carrier injection, for example by n-type and p-type regions when connected to a cathode and an anode, respectively.

A p-type region 112, which is p-type doped GaN layer, is shown on top of the light emitting region 110. The p-type region 112 provides a p-type region for carrier injection into the light emitting region 110.

Whilst the p-type region 112 is show to be a p-GaN layer, additionally or alternatively, the p-type region 112 is formed from a different material.

Whilst the light emitting region 110 comprises MQWs, in further examples, the light emitting region 110 may have a single quantum well (SQW). Additionally or alternatively, the light emitting region 110 may include one or more quantum dots. The quantum wells and quantum dots confine carriers and, in use, provide a source of light based on carrier recombination in the quantum structures following carrier injection by n-type and p-type regions when connected to a cathode and an anode, respectively.

Whilst the n-type region is typically formed on a substrate, alternatively, the n-type region may itself be a free-standing substrate suitable for the growth of subsequent crystalline layers. In an example, the substrate is a sapphire substrate. In further examples, the substrate is a silicon substrate, or GaN substrate.

The epitaxial structure 100A is grown using an MOCVD reactor. Advantageously, such epitaxial structure 100A can be optimised for MOCVD growth and provide high quality growth for efficient generation of light. Additionally or alternatively, other deposition and/or growth methods may be used to provide the epitaxial structure 100A, such as MBE.

The n-type buffer region 102 is formed from n-type gallium nitride. However, in further examples the n-type buffer region 102 may be formed from and/or based on other material. The barrier layer 104 is formed from aluminium gallium nitride, for example 10% aluminium AlGaN. Advantageously, the use of an AlGaN barrier aids the prevention of electron leakage between pixels in multi-pixel structures. However, in further examples, additionally or alternatively, the barrier layer 104 is not used, or may be formed from different materials. The superlattice 108 is formed from gallium nitride based materials. Additionally or alternatively, the superlattice 108 is formed from other materials. The light emitting region 110 comprises at least one quantum well. Additionally or alternatively, the light emitting region 110 comprises further quantum wells. Additionally or alternatively, the light emitting region 110 comprises quantum dots or other quantum structures. The light emitting region 110 is a gallium nitride based region whereby the at least quantum well is formed from a gallium nitride based material such as indium gallium nitride (InGaN), or aluminium indium gallium nitride (AlInGaN). Additionally or alternatively, different materials are used, depending on the structure that is to be grown. The composition of quantum wells in the light emitting region 110 is determined based on the primary peak wavelength that is selected for emission from the light emitting region 110. The p-type region 112 is formed from gallium nitride. Additionally or alternatively, different material may be used to form the p-type region 112. The light emitting region 110 does not contain any doping, for example it does not contain silicon doping or magnesium doping through intentional doping of the light emitting region 110 during the growth of the structure 100A. In further examples, doping is used in the light emitting region 110 to the extent that it does not affect the carrier injection in order to emit light via the light emitting surface of a pixel defined by a via passing through the light emitting region 110. In further examples, different semiconductor layers are formed, by growth or otherwise in order to provide the necessary base structure for processing monolithic arrays of micro LEDs.

Whilst a particular epitaxial structure 100A is shown at FIG. 1A, the skilled person understands that additional layers, the exclusion of layers and alternative layers may be used in order to implement the concepts described herein, depending on the particular needs of the specific implementation. The description of layers formed on top of other layers indicates a positional relation in respect of the order of the growth of the layers and does not necessarily preclude the presence of layers in between a first layer and a second layer that is described as being on top of the first layer.

Once the epitaxial structure 100A has been provided, it can be processed in order to provide conducting regions through which carriers can be injected into the eventual structure.

Accordingly, FIG. 1B shows a processed epitaxial structure 100B. There is show the epitaxial structure 100A of FIG. 1A, with an additional mask layer 114. The mask layer 114 is formed and processed using known techniques, including lithographical techniques, in order selectively to create apertures and expose portions of the underlying epitaxial structure 100B, for example the p-type region 112. Once portions of the mask layer 114 have been selectively removed, selective etching of the underlying epitaxial structure 100B is performed. Such selective etching provides vias in the epitaxial structure 100B. The vias are created by removal of material in order to leave pathways through the remaining material. Depending on the shape of the area exposed in the mask layer 114 and the depth of the etching, the vias that are formed will have a corresponding form which, in an example, is that of a trench via or a columnar via. Whilst vias are created by etching material to leave trenches, holes or other pathways, in further examples, vias are additionally or alternatively created by forming materials such that the absence of material, as opposed to the removal of material, creates the via structures within the other structures. Advantageously, the vias 115 are etched to the AlGaN barrier layer 104, thereby to provide improved isolation of the pixels. Beneficially, the AlGaN barrier layer 104 provides an etch stop for etching of the vias 115.

In an example the mask layer 114 is silicon nitride. Additionally or alternatively, different material is used, such as silicon dioxide. Advantageously, silicon nitride is an effective and controllable mask layer 114 for subsequent processing steps.

FIG. 1C shows a further processed epitaxial structure 100D, with vias 115 that have been etched through the epitaxial structure 100. The vias 115 are shown to have been etched through the epitaxial structure 100B into the undoped region 106 at a depth 201 from the surface of the epitaxial structure 100C. In order to etch the vias 115, lithographical techniques are used in order to pattern a mask layer and to open apertures in the mask layer to enable the etching of the material exposed by the apertures formed in the mask. The vias 115 are shown in cross-section. In plan view the vias 115 are formed in a grid structure (e.g., see the grid of FIG. 2), in order to define pixels, where the vias define the perimeter of a light emitting surface of each individual pixel 208 by passing through the light emitting region 110 in order to form a trench via 115 isolating each individual pixel. The width 210 of a pixel 208 is the distance between the vias 115 shown in FIG. 1C. Whilst the via 115 is shown to have been etched into the undoped region 106, in further examples, alternatively or additionally, the via 115 is etched to a depth 201 that is shallower or deeper than that shown at FIG. 1C, whilst still passing through the light emitting region 110, thereby defining the perimeter of a pixel.

Whilst vias 115 forming trenches defining the light emitting surfaces of pixels 208 by passing through the light emitting region 110 of epitaxial structures is shown based on etching of epitaxial structures, in further examples, other techniques are used to form light emitting regions with vias passing through them in order to define the perimeters of light emitting surfaces of pixels in an array of pixels.

In an example, the vias 115 are formed using dry etching techniques, such as plasma based techniques. Preferably, wet etch treatment is used in order to recover any damage caused by the etching of the vias 115. Additionally or alternatively, any suitable etching technique is used in order to form vias 115.

Once the vias 115 have been formed in the epitaxial structure 100C, selective overgrowth of n-type material is formed. FIG. 1D shows the structure 100C of FIG. 1C that has been further processed in order to provide a light emitting structure 100D. There is shown vias 115 passing through the light emitting region 110 to the undoped region 106. There is also shown a further mask layer (shown as mask layer 117 on the p-type region 112 and adding to the mask layer 114) onto the mask layer 114 of FIG. 1C. The further mask layer 117 and mask layer 114 are selectively patterned and processed in order to create apertures 111 to expose the underlying structure through the mask layers 114, 117, down to the p-type region 112, using known lithographic and etching techniques.

The exposed aperture 111 in the mask layer 114 and further mask layer 117 is formed centrally within the pixel perimeter defined by the via 115 that has been formed through the light emitting region 110. Additionally or alternatively, the aperture 111 is located at any suitable position in order to provide light emission. The cross sectional shape of the aperture when seen in plan view is determined by the patterning and etching steps that are used in order to provide the aperture. The aperture 111 has a width of approximately 800 nm. In further examples, the aperture 111 has a width 206 sized to meet preferred implementations regarding carrier injection and arrangement of pixels. Once the aperture 111 been provided, selected area overgrowth of n-type material to form an n-type region 116 for the injection of carriers into the light emitting region 110 is provided. The light emitting structure 100D of FIG. 1D is processed to provide the light emitting structure 100E of FIG. 1E, where the n-type region 116 is shown in the aperture 111, such that the n-type region 116 is grown on top of the p-type region 112. The further mask layer 117 is shown to have been removed in FIG. 1E. In order to enable carriers to be injected into the light emitting region 110, electrical contact is formed with the p-type region 112. This is shown at FIG. 1F.

FIG. 1F shows the same basic structure 100A, 100B, 100C, 100D, 100E as shown in FIGS. 1A, 1B, 1C, 1D and 1E, however, the structure 100F of FIG. 1F is shown to have been processed further. The processed epitaxial structure 100F of FIG. 1F illustrates the deposit mask layer 114 which in an example is a silicon nitride layer, which has been etched through in order to provide vias 115, as shown in FIGS. 1A to 1E. The vias 115 have been vertically etched through the epitaxial structure 100F to the undoped region 106. Subsequently, conductive material 120 has been formed in the vias 115 to provide a conducting region that passes through the light emitting region 110. Such conductive material is metal and is provided by known deposition techniques combined with known lithographical techniques. In an example, the conductive material is a highly reflective metal that beneficially provides a common electrode and good optical isolation within pixels. Whilst the metal is shown to have been deposited after the selected area growth of the n-type region 116, in further examples, alternatively or additionally the material is deposited in the vias prior to the selected area overgrowth of the n-type region. In an example, metal is deposited in the vias after the vias 115 have been etched, thereby taking advantage of the mask layer 114 to provide apertures for the deposition of metal in the vias 115. Once the epitaxial structure 100F has been provided, it is processed in order to form a light emitting diode device. Such overgrowth, or deposition, of material in vias 115 can be made with the mask layer 114 remaining in place, such that no growth occurs on the p-type region 112, for example.

The n-type region 116 is shown to be proud of the surface of the masked layer 114. Advantageously, this enables contacting of the doped overgrowth. The structure 100F is not shown to scale, however, in an example the structure formed on the n-type buffer region 102 may be approximately 300 nm in thickness 202, with the n-type region 116 extending a further 700 nm in height 204 beyond the thickness 202 of the epitaxial structure 200. In an example, the via 115 may be approximately 800 nm in width 206. In further examples the size of structures is determined by the techniques used and structure that is desired, for example. For example, the crystal habit of the material used may determine the growth shape of the material proud surface of any masked layer. By etching through apertures that have been exposed in the masked layer 114 a grid may be formed by depositing material 120 in the via 115, as shown in FIG. 2.

As shown by the arrows, in FIG. 1F, the n-type region 116 provides an effective cathode and the material 120 formed in the vias 115 provides an effective anode, thereby to allow injection of carriers into the light emitting region 110 when a suitable power source is used. Carriers from the n-type region 116 diffuse through the p-type region 112 before carriers from the n-type region 116 and the p-type region 112 recombine in the light emitting region 110. Advantageously, carrier injection of electrons and holes is accomplished from the same side of the light emitting region 110, thereby providing 'top' injection straight into the quantum wells. The carrier injection into the light emitting region 110 may be based on the carrier diffusion length of the carriers injected into the multiple quantum well structure of the light emitting region 110 to provide light that can be emitted via a light emitting surface defined by the pixel perimeter formed by the material 120 in the vias 115 etched through the light emitting region 110. A plan view 300 of the light emitting structure 100F is shown at FIG. 3.

FIG. 3 shows the material 120 formed in vias 115 that provide a grid via etched through the structure 100A as described with respect to FIG. 1A. Further, n-type region 116 formed in apertures 111 in the pixels 208 defined by the material 120 in the vias 115 of the common electrode provided by the material 120 in the vias is shown. In an example, the apertures 111, and n-type region 116 are centrally formed in each of the pixels 208 that are to be addressed, thereby providing central apertures 111. The n-type region 116 is shown in central positions in each of the pixels 208. Such an arrangement of a common anode electrode enabling carrier injection in the p-type region 112 and individual columnar n-type region 116 that can form independently addressable anode electrodes can be used in order to energise individual pixels 208 in a monochromatic high resolution micro LED array.

FIG. 1G shows a cross-sectional view of a processed light emitting structure as described with respect to FIGS. 1A to 1F. The processed light emitting diode device structure 100G is provided by flipping the light emitting structure of FIG. 1F in order to extract light through the n-type buffer region 102 and thus avoid absorption due to the p-type contact 124 (arrows in FIG. 1G show the direction of light from the light emitting surface of a pixel 208 defined by vias 115 passing through the light emitting region 110). There is also shown anode connections forming an n-type contact 125 that connects to the material formed in the vias 115. The anode connections 125 form a common electrode following a grid pattern, such as that shown at FIGS. 2 and 3.

Further, FIG. 1G shows an insulating layer 122. The insulating layer 122 insulates any connections used to contact the p-type and n-type regions. Preferably, the insulating layer is silicon dioxide. There is shown a p-type contact 124 to which the cathode of each pixel 208 that is to be addressed is connected. Additionally, there is shown a mirror/barrier layer 126 configured to reflect light emitted from the light emitting region 110 out of a light emitting surface defined by the n-type region 116 in the vias 115 defining the perimeter of the pixels 208. The structure may be planarized such that a planarized insulating layer 122 provides a surface to which a backplane might connect to contact 124, 125 and other contacts 124, 125 in other pixels 208 such that each pixel 208 might be individually addressed. Advantageously, the contact 124 may be connected to a backplane such that a contact 124 for each pixel in an array is contacted and independently addressable.

There is shown a transparent conducting layer 128, which may preferably be Indium Tin Oxide (ITO), formed on the n-type buffer region 102 in order to provide conduction and efficient light extraction from the pixel 208 of the light emitting array of micro LEDs.

Advantageously, no electrical isolation etch between pixels is required, as the metal formed in the vias 115 provides a common electrode. The n-type region 116 is electrically isolated by design without the need for an etch. This allows for tighter pixel integration whilst retaining good optical isolation.

Whilst a single pixel cross section (with width 210) is shown in FIGS. 2 and 3, it is understood that selective etching of the epitaxial structure 100, described with reference to FIGS. 1A to 1G, and formation of conductive material 120 in via trenches provided by the selective etching will result in an electrode grid that is a effectively a common electrode (in this case a anode) for all of the pixels defined by the conductive material 120 passing through the light emitting region 110 of the epitaxial structure 100. Advantageously, selective area growth of n-type material is performed using a metalorganic chemical vapour deposition (MOCVD) reactor that uses relatively high temperatures. Such relatively high temperatures anneal defects and passivate any open MQW surface. No dangling bonds in the MQW perimeter are left after processing and hence no passivation is needed. Therefore, beneficially, much reduced non-radiative recombination is achieved in the light emitting region 110. In an example, the common electrode defines at least one pixel peripherally entirely by a single electrode, thereby isolating the pixel.

FIG. 3 shows a plan view 300 of the corresponding structure 100F shown in FIG. 1F. The plan view 300 shows more pixels 208 than shown in FIG. 1F. The skilled person understands that the number of pixels 208 formable by the method described herein is not limited to the number of pixels 208 shown in FIG. 3 and that FIG. 3 shows an exemplary portion of a plan view 300 of vias 115 etched through an epitaxial structure with material 120 that is conductive in the vias 115. The grid structure is used to form a common electrode, such as a common anode, using conductive material 120. The grid can be used to define pixels 208 (only one of the pixels is labelled, however, it is clear that the matrix formed by the vias 115 that are trench vias with conductive material 120 is used to define multiple pixels 208) where the light emitting surface of each pixel 208 is shown as the area in the plan view 300 of the square pixels 208 defined by the selectively etched vias 115 formed in a grid matrix with conductive material 120 in the vias 115. Whilst vias are created by etching material to leave trenches, holes or other pathways, in further examples, vias are additionally or alternatively created by forming materials such that the absence of material, as opposed to the removal of material, creates the via structures within the other structures.

In an example the width 210 of pixel 208 is approximately 3 μm. The width 210 of pixel 208 is preferably selected based on the carrier diffusion length that is used to enable efficient light emission from the light emitting surface of pixel 208. Advantageously, as the electrode that is formed by the conductive material 120 runs around the perimeter of each pixel 208, passing through the light emitting region 110, no further electrical isolation of the pixel 208 is needed. In further examples, the light emitting surface of each pixel 208 is less than 100 microns squared. In yet further examples, the light emitting surface of each pixel 208 is less than 16 microns squared. Whilst the pixels 208 are shown to have the same size and shaped light emitting surface, in further examples an array is provided with different pixels of different shapes and/or sizes.

Whilst cross-sectional views of individual pixels are shown in FIGS. 1A to 1G, the skilled person understands that each pixel forms part of an array of pixels. Whilst the array is shown as a grid with square shaped pixels (e.g., in FIGS. 2 and 3), in further examples different shaped pixels may be provided by etching different patterns through the epitaxial structure shown at FIG. 1, for example.

Advantageously, the use of metal as the conductive material 120 in the vias 115 provides optical isolation of the pixels. The metal can be highly reflective and along with a metal layer, such as the mirror/barrier layer 126 deposited on the pixel surface, can provide improved light output and good pixel contrast.

Further, beneficially, electrons propagate easily through the p-type region 112 from the n-type region 116, thereby to provide efficient recombination in the light emitting region 110.

Advantageously, only the n-type material is overgrown to provide the n-type region to provide a forward-biased junction. Advantageously, carriers diffuse to the light emitting region from the p-type region and n-type region against the electric field direction, thereby removing the need for an electron blocking layer. Advantageously, since the p-type region 112 and the n-type region 116 are on the same side of the light emitting region 110, these relatively thin regions can be etched with a very shallow etch, which in turn limits etch damage. Further, the protrusion of the n-type region 116 is conducive to having a buried common metal and common anode configuration.

Advantageously, the buffer thickness of the n-type buffer region 102 can be used for forming light extraction features in order to aid light extraction from the LED structure. The n-type buffer region 102 can be thinned down as required, which is advantageous for small pitch arrays. Beneficially, the use of vias 115 with conductive material means that any roughening etch to improve light extraction need no physical isolate the pixels to achieve electrical isolation, as the majority of the buffer can by the insulating undoped GaN region 106. This may be aided in an example by stopping the etch of the vias at the AlGaN barrier layer 104.

Whilst the concept of a template to provide a grid of vias passing through a light emitting region and defining pixels, with a p-GaN p-type region 118 with centrally positioned n-type overgrowth 116 provided by n-GaN on the same side of a light emitting region 110 is shown, in further examples, different implementations of the concept are possible, some of which are described in with respect to the following figures.

For example, monolithic high resolution micro LED arrays with vias defining pixels might be provided using different structures that use carrier diffusion into quantum structures, where carriers from at least one of the p-type and n-type regions diffuses through the other of the n-type and p-type region prior to recombination in the light emitting region.

FIG. 4 shows a cross sectional view of a light emitting structure 400 in accordance with the above described concept (where one pixel of a pixel array is defined and the same nomenclature is used in order to draw parallels between the pixels 208 with a pixel width 210 illustrated in FIGS. 2 and 3, for example). There is shown the same epitaxial structure 100F described with respect to FIG. 1F. In the example of FIG. 4, instead of forming a p-type region 112 on the light emitting region 110, an n-type region 113 is formed on the light emitting region 110. Subsequently, a mask layer 114 is deposited and processed in order to provide apertures. The apertures are etched through the masked layer 114 in order to form vias 115 that terminate in the undoped region 106, in order to provide trenches for the deposition of conductive material 120 in the vias 115. Conductive material 120 in these vias 115, which are trench vias, is used to provide a common electrode grid passing through the light emitting region 110 that defines pixels 208 and that effectively provides a common cathode grid enabling the injection of carriers into the n-type region 113. In a complementary method to that described with respect to FIGS. 1 to 3, a anode can be provided in each pixel 208 by opening a central aperture 111 in a further mask layer 117 and depositing/growing a p-type region 118 by overgrowth of p-type material on the n-type region 113. Patterning and etching steps are implemented depending on the specific structure that is to be produced and may use known techniques. In the example of FIG. 4, carriers from the p-type region 118 diffuse through the n-type region 113 before carriers from the n-type region 113 and the p-type region 118 recombine in the light emitting region 110.

FIGS. 5 and 6 describe further examples of the implementation of carrier injection into p-type and n-type regions such that carriers from one of the p-type region and the n-type region diffuse through the other of the n-type region and the p-type region before recombination in the light emitting region.

FIG. 5 shows a processed light emitting structure 500 based on the light emitting structure 100E described with respect to FIG. 1E. In FIG. 5, instead of forming conductive material 120, for example by the deposition of metal in the vias 115, a further overgrowth step is used to form a p-type region 118 in the vias 115. N-type overgrowth to form n-type regions 116 in the centre of pixels 208 is used in a similar manner to that described with respect to FIG. 1. Electrodes form electrical connection with the n-type region 116 and the p-type region 112 by virtue of electrical contact with the p-type overgrowth 118 in the vias 115 and the n-type overgrowth 116. The vias 115 comprising p-type overgrowth material define pixel perimeters and work in combination with the p-type region 112 that is an epitaxial layer in order to provide carriers that recombine with carriers generated by the n-type region 116 that diffuse through the p-type region 112 prior to recombination in the light emitting region 110. The p-type region 112 is an epitaxial layer and the p-type overgrowth 118 takes the morphology of the vias 115 within the vias. In further examples, additionally or alternatively, the p-type region 112 and the p-type overgrowth 118 are formed with different shapes whilst providing the effect of diffusion of carriers into the light emitting region 110 from the same side of the light emitting region 110.

FIG. 6 shows a processed light emitting structure 600 that shares an n-type layer 113 as described with respect to FIG. 4. In FIG. 6, instead of forming conductive material 120 in the vias 115, n-type region 116 is formed in the vias 115 by overgrowth of n-type material to provide an n-type region 116 in the vias 115 that works with the n-type layer 113 to provide carriers that diffuse into the light emitting region 110 before recombination with carriers generated in the p-type region 118 that diffuse through the n-type layer 113 prior to recombination in the light emitting region 110. P-type overgrowth to form p-type regions 118 in the centre of pixels 208 is used in a similar manner to that described with respect to FIG. 1. Further, the vias 115 are shown to have been etched to the n-type buffer region 102. In further examples, alternatively or additionally, the vias 115 are etched to different depths in the structure 600, whilst passing through the light emitting region 110 thereby to define pixel perimeters. The n-type region 113 is an epitaxial layer and the n-type overgrowth 116 takes the morphology of the vias 115 in the vias 115. In further examples, additionally or alternatively, the n-type region 113 and the n-type overgrowth 116 are formed with different shapes whilst providing the effect of diffusion of carriers into the light emitting region 110 from the same side of the light emitting region 110.

Whilst a monochromatic high resolution micro LED array has been described above, it is possible to provide a multi colour high resolution micro LED array based on etching through multiple light emitting regions, as described here.

FIG. 7 shows an epitaxial structure 700. The epitaxial structure 700 is provided in a similar manner to the epitaxial structure 100 described with reference to FIG. 1. In the example of FIG. 7, rather than having one light emitting region 110 arranged to emit light with a peak primary wavelength, the structure 700 has three light emitting regions. Further, the p-type region is not grown on top of the initial structure and is deposited/grown at a later stage. There is shown a superlattice 706 upon which a first light emitting region 707 is provided. Upon the first light emitting region 707 there is provided an undoped region 702, followed by a second superlattice 708 and a second light emitting region 709. Upon the second light emitting region 709 there is provided a further undoped region 704 and a third superlattice 710, followed by a third light emitting region 711. The first light emitting region 707 is configured to emit a primary peak wavelength that is different from the primary peak wavelength that the second light emitting region 709 is configured to emit, which is in turn different from the primary peak wavelength that the third light emitting region 711 is configured to emit. The first light emitting region 707 is configured to emit blue light, the second light emitting region 709 is configured to emit green light and the third light emitting region 711 is configured to emit red light. This structure 700, which typically has a thickness 712 between 600 nm and 800 nm is an epitaxial structure 700 that forms the basis for processing (which can include further growth steps) in order to provide a monolithic high resolution RGB micro LED array.

Beneficially, the structure 700 is formed in one growth process. Advantageously, the structure 700 is formed such that the light emitting regions 707, 709, 711 are relatively closely spaced, vertically (as demonstrated by the thickness 712, which includes the light emitting regions 707, 709, 711, and also superlattice structures and undoped recovery layers), and hence subsequently, shallow etches can be used to etch through and remove light emitting regions 707, 709, 711 where certain of the light emitting regions 707, 709, 711 are considered superfluous. This proves particularly beneficial in the following processes for providing a high resolution monolithic colour array of micro LEDs.

The epitaxial structure 700 of FIG. 7 is processed in a similar way to the epitaxial structure 100 of FIG. 1 in order to provide the processed structure 800 of FIG. 8A. FIG. 8A shows a mask layer 804 deposited onto the epitaxial structure 700 and patterned using lithographical techniques in order to expose the underlying epitaxial structure 700 to enable selective etching through the epitaxial structure 700 and, in particular, through the three light emitting regions 707, 709, 711. Selective etching (typically using dry etching techniques) through the epitaxial structure 700 provides vias 802 that can be filled by forming a conductive material 801 in the vias 802. The conductive material 801 is shown to be deposited in the vias 802 in FIG. 11. The conductive material 801 is deposited in the vias 802 using known lithographical and deposition processing techniques and may be implemented at any appropriate stage during the processing the epitaxial structure 700 to provide a multi colour light emitting device.

The vias 802 and the conductive material 801 in the vias 802 passes through the light emitting regions 707, 709, 711 to define the perimeters of individual pixels. This is demonstrated in the plan view 800' of FIG. 8B, which shows pixels 806 (only one labelled) surrounded by conductive material 801 formed in vias 802 that are trench vias and effectively providing a common electrode for the pixels 806. As shown in FIGS. 8A and 8B, the pixels defined with vias 802 that are trench vias passing through the light emitting regions 707, 709, 711 each has three different light emitting regions 707, 709, 711. Therefore, in order to provide an RGB array, the pixels are selectively etched in order to remove undesired wavelengths in particular pixels. This is demonstrated with reference to FIGS. 9A and 9B.

FIG. 9A shows how the unwanted longest wavelength is locally removed in order to leave the light emitting region desired for each individual pixel. There is shown in processed epitaxial structure 900 of FIG. 9A the conductive material 801 in the vias 802 forming a common grid anode passing through all of the light emitting regions 707, 709, 711. In a first pixel 902, the green second light emitting region 709 and the red third light emitting region 711 have been etched away in order to leave the blue, first light emitting region 707. In a second pixel 904, the red, third light emitting region 709 has been etched away in order to leave the blue, first light emitting region 707 and the second, green, light emitting region 709. In a third pixel 906, none of the light emitting regions 707, 709, 711 have been removed and therefore all remain. Each of the pixels 902, 904, 906 is defined by the vias 802 etched through the epitaxial structure 700 and in particular through the light emitting regions 707, 709, 711. Once the pixels have been etched, a p-type region 901 is formed on the epitaxial structure, such that the p-type region is adjacent each respective light emitting region. Advantageously, the p-type region is formed for each of the pixels 902, 904, 904 in a single process growth step.

FIG. 9B shows how selective etching of the light emitting regions 707, 709, 711 results in pixels dedicated to emitting different wavelengths. For example, the first pixel 902 can be contacted in order to emit blue light. The second pixel 904 can be contacted in order to emit green light. The third pixel 906 can be contacted in order to emit red light. A high resolution monolithic red-green-blue light emitting micro LED array can be formed by selectively dedicating pixels to particular primary peak wavelength emissions.

FIG. 10A shows a thin and conformal mask layer 1001 that is patterned and opened in order to expose central holes in each pixel 902, 904, 906. Once central holes have been exposed (using lithographical techniques) in each of the pixels 902, 904, 906, the epitaxial structure 700 can selectively be etched in order to provide apertures in the mask layer 1001 in which n-type region 1002 is formed. As the locally longest wavelength light emitting region has been removed, the selective etch passes into the light emitting region of the desired wavelength for each pixel. Advantageously, the creation of the structure and the processing of the structure are arranged in order to minimise the number of processing steps to form the resultant structure. This is demonstrated in FIG. 10B, which shows plan view 1000' of an array with n-type region 1002 forming a central p-type region 1002 in each of the pixels 902, 904, 906.

In a similar manner to that described above with respect to the monochromatic monolithic high resolution micro LED array, the processed light emitting structure 1000 can be flipped and further processed in order to connect with a backplane for control of individual pixels. FIG. 11 shows a cross sectional view of a light emitting array 1100 with three different colour pixels. There is shown the first pixel 902, configured to emit light with a primary peak wavelength that is blue, the second pixel 904, configured to emit light with a primary peak wavelength that is green and the third pixel 906, configured to emit light with a primary peak wavelength that is red.

Carrier injection into each of the pixels 902, 904, 906 occurs by diffusion of carriers into the local light emitting region (711 for 906, 709 for 904 and 707 for 902). Carriers injected in the n-type region 1002 diffuse through the p-type region 901 before recombination in the associated light emitting region. Whilst the high resolution RGB micro LED array is described with reference to a common anode formed with conductive material formed in vias defining the perimeter of pixels and n-type region forming central n-type regions in each individual pixel for back plate connection, the skilled person understands that alternative implementations, for example those described with reference to the high resolution monochromatic micro LED array can be applied to the high resolution RGB micro LED array, including, for example, where an n-type region provided by an n-type layer is formed instead of p-type region 901 formed by a p-type layer 901 and the central n-type regions 1002 are replaced with p-type overgrowth to form central p-type regions. Further, the skilled person understands that, whilst the example shown with respect to FIGS. 7 to 11 shows the formation of vias 802 defining pixel perimeters by passing through the light emitting regions 707, 709, 711, with conductive material 801 in the vias 802 and central n-type region in each pixel with a p-type region 901 formed on the light emitting structure, in further examples different implementations are used (for example, using any of the implementations described with respect to FIGS. 1 to 6).

Advantageously, different active regions are deposited in the same step by the formation of a layer providing the p-type region 901. Beneficially, holes do not propagate deep into the structure and therefore vertical propagation only to the closest QW structure can be achieved, which in turn leads to better colour purity in multi-colour displays. Advantageously, when the layer providing the p-type region 901 is substituted with an n-type layer and p-type regions are used centrally within pixels instead of n-type regions, electrons move against a potential gradient once they diffuse beyond the p-type material and therefore are not expected to diffuse deep into the quantum well structures of the light emitting region.

Whilst the above describes pixels with a light emitting surface defining a pixel, where the pixel perimeter is defined by a via passing through one or more of the light emitting regions, such that the a pixel is configured to emit light with a primary peak wavelength, in an example, for a multicolour structure, a common via is formed through multiple light emitting regions and portions of the light emitting surface defined by the via forming the perimeter are selectively etched in order to form contacts, using overgrowth, as described above, such that a plurality of different primary peak wavelengths might be emitted from a pixel. Advantageously, such a structure enables tighter integration of micro LEDs.

Advantageously, by using the above described structures and methods, monolithic arrays of high resolution micro LEDs are provided. Such arrays can include monochromatic or multi-coloured arrays and are thus applicable to a multitude of applications requiring high resolution light emitting structures. Beneficially, the pixel pitch of such monolithic high resolution micro LED arrays is less than 10 microns. In some examples, the pixel pitch of such monolithic high resolution micro LED arrays is less than 4 microns. In further examples, the pixel pitch of such monolithic high resolution micro LED arrays is less than 3 microns. Whilst arrays are described with respect to square pixels in a grid formation, other formations and patterns of pixels in arrays are implemented in further examples.

High quality emissive arrays are formed at least in part due to the use of a planar epitaxial structure that is formed (grown or provided) and processed with minimal overgrowth in order to isolate pixels in a tightly integrated array. Beneficially, the vias passing through the light emitting region of the epitaxial structure simultaneously isolate pixels and provide means for improved electrical contact for all of the pixels in the array. Advantageously, the provision of a stack of light emitting regions means that the desired light emitting regions can be identified and their surface exposed for efficient processing and contacting in order to provide improved light emitting diode structures and monolithic high resolution micro LED arrays.

Whilst the above LED structures are described with reference to growth by MOCVD, growth by different and/or supplementary techniques is beneficial in some examples. For example, growth by MBE may enable cooler and/or slower growth rates which may have benefits in respect of the above described growth and processing steps. Whilst the above process steps are described in any order, the skilled person understands that in further examples the process steps are performed in any order that is suitable to obtain the target structure.

What is claimed is:

1. A light emitting diode structure comprising:
a p-type region;
an n-type region;
a light emitting region for recombination of carriers injectable by the p-type region and the n-type region; and
a via passing through the light emitting region, wherein the via defines a perimeter of a light emitting surface of at least one pixel and comprises a material configured to enable injection of carriers into the p-type region or the n-type region, wherein one of the p-type region and n-type region is configured such that carriers generated in the one of the p-type region and the n-type region diffuses through the other one of the n-type region and the p-type region prior to recombination in the light emitting region.

2. The light emitting diode structure of claim 1, wherein the light emitting region comprises at least one epitaxial quantum well layer and/or wherein the p-type region and the n-type region are on the same side of the light emitting region.

3. The light emitting diode structure of claim 1, wherein the material comprises at least part of the n-type region or p-type region and/or wherein the material comprises a conductive material, wherein the conductive material is a metal.

4. The light emitting diode structure of claim 1, comprising a further light emitting region, wherein the light emitting region and the further light emitting region are separated by an undoped region thereby to provide a stack of light emitting regions, more wherein the via passes through both the light emitting region and the further light emitting region, yet more wherein the light emitting region and the further light emitting region are configured to emit light of different wavelengths, still more wherein the light emitting region and the further light emitting region are arranged such that the surface areas of the light emitting region and further light emitting region partially overlap.

5. The light emitting diode structure of claim 4, comprising at least three light emitting regions, wherein one of the light emitting regions emits blue light, one of the light emitting regions emits green light and one of the light emitting regions emits red light.

6. The light emitting diode structure of claim 1, wherein the via is a grid via defining an array comprising a plurality of pixels, wherein the grid via is arranged to provide a common electrode, wherein at least one pixel of the plurality of pixels comprises a further electrode, wherein the further electrode is centrally located within the perimeter of the light emitting surface of at least one pixel, wherein at least two pixels are configured to emit light of different wavelengths.

7. The light emitting diode structure of claim 1, wherein the light emitting region and/or further light emitting region is formed on an undoped epitaxial layer and/or wherein the light emitting region and/or further light emitting region is formed between undoped epitaxial layers, wherein the undoped epitaxial layer is formed on a barrier layer configured to block vertical carrier diffusion, wherein the undoped epitaxial layer is gallium nitride, wherein the barrier layer is AlGaN.

8. The light emitting diode structure of claim 1, wherein at least one of the n-type region and the p-type region is formed in a via that is connected to a planar n-type region or a planar p-type region respectively.

9. The light emitting diode structure of claim 1, wherein at least one of the n-type region and the p-type region is formed by selected area growth.

10. The light emitting diode structure of claim 1, wherein the via is an etched via and/or wherein the light emitting surface has an area based on the diffusion length of carriers within the light emitting region, wherein the light emitting surface area is less than or equal to 100 µm2.

11. The light emitting diode structure of claim 1, wherein the at least one pixel is defined peripherally entirely by a single electrode.

12. The light emitting diode structure of claim 1, wherein the light emitting diode structure is in the form of a micro LED array.

13. The light emitting diode structure of claim 12, wherein the array is a multi-colour array, wherein the array has a pixel pitch less than 10 microns.

14. A method of forming a light emitting diode structure comprising:
forming a p-type region;
forming an n-type region;
forming an light emitting region for recombination of carriers injectable by the p-type region and the n-type region; and
forming a via passing through the light emitting region, wherein the via defines a perimeter of a light emitting surface of at least one pixel and comprises a material configured to enable injection of carriers into the p-type region or the n-type region, wherein one of the p-type region and n-type region is configured such that carriers generated in the one of the p-type region and the n-type region diffuses through the other one of the n-type region and the p-type region prior to recombination in the light emitting region.

15. The method of claim 14 wherein forming the light emitting region comprises forming at least one epitaxial quantum well layer.

16. The method of claim 14, comprising forming the p-type region and the n-type region are on the same side of the light emitting region.

17. The method of claim 14, wherein the material comprises at least part of the p-type region or the n-type region and/or wherein the material comprises a conductive material, wherein the conductive material is a metal.

18. The method of claim 14, comprising providing a further light emitting region, wherein the light emitting region and the further light emitting region are separated by an undoped region thereby to provide a stack of light emitting regions, wherein the via passes through both the light emitting region and the further light emitting region, wherein the light emitting region and the further light emitting region are configured to emit light of different wavelengths, and wherein the light emitting region and the further light emitting region are arranged such that the surface areas of the light emitting region and further light emitting region partially overlap.

19. The method of claim 18, comprising at least three light emitting regions, wherein one of the light emitting regions emits blue light, one of the light emitting regions emits green light and one of the light emitting regions emits red light, wherein the planar surface area of the further light emitting region is less than the planar surface area of the light emitting region.

20. The method of claim 14, wherein the via is a grid via defining a plurality of pixels, wherein the grid is arranged to provide a common electrode, further comprising forming a further electrode for at least one of the pixels, wherein the further electrode is formed centrally within the perimeter of the light emitting surface of the at least one pixel, wherein at least two pixels are configured to emit light of different wavelengths.

21. The method of claim 14, comprising forming the n-type region and the p-type region in a via that is connected to a planar n-type region or a planar p-type region respectively.

22. The method of claim 14, comprising forming at least one of the n-type region and the p-type region by selected area growth.

23. The method of claim 14, comprising etching through the light emitting region to form the via defining the perimeter of the light emitting surface.

24. The method of on claim 18, comprising at least partially etching through at least one light emitting region in order locally to remove an unwanted longest wavelength, preferably prior to forming each of the n-type region and the p-type region associated with the light emitting region and the further light emitting region respectively.

\* \* \* \* \*